(12) United States Patent
Ghosh et al.

(10) Patent No.: US 11,527,999 B2
(45) Date of Patent: Dec. 13, 2022

(54) DYNAMIC BIASING CIRCUIT

(71) Applicant: TEXAS INSTRUMENTS INCORPORATED, Dallas, TX (US)

(72) Inventors: Sovan Ghosh, Paschim Medinipur (IN); Amal Kumar Kundu, Bengaluru (IN); Laxmi Vivek Tripurari, Hyderabad (IN); Anand Subramanian, Bengaluru (IN)

(73) Assignee: Texas Instruments Incorporated, Dallas, TX (US)

( * ) Notice: Subject to any disclaimer, the term of this patent is extended or adjusted under 35 U.S.C. 154(b) by 5 days.

(21) Appl. No.: 17/027,093

(22) Filed: Sep. 21, 2020

(65) Prior Publication Data

US 2021/0006211 A1  Jan. 7, 2021

Related U.S. Application Data

(63) Continuation of application No. 16/574,231, filed on Sep. 18, 2019, now Pat. No. 10,819,294.

(30) Foreign Application Priority Data

Apr. 22, 2019 (IN) .............................. 201941015818

(51) Int. Cl.
*H03F 1/56* (2006.01)
*H04R 3/04* (2006.01)
*H04R 3/00* (2006.01)

(52) U.S. Cl.
CPC .............. *H03F 1/56* (2013.01); *H04R 3/005* (2013.01); *H04R 3/04* (2013.01); *H03F 2200/03* (2013.01)

(58) Field of Classification Search
None
See application file for complete search history.

(56) References Cited

U.S. PATENT DOCUMENTS

| 7,095,278 | B2 * | 8/2006 | Fuller | H03F 1/0211 |
| | | | | 330/149 |
| 8,183,923 | B2 * | 5/2012 | Mirow | H03F 3/45085 |
| | | | | 330/85 |
| 10,110,166 | B1 * | 10/2018 | Noori | H03B 5/1215 |
| 10,503,188 | B2 * | 12/2019 | Ramos | G05F 1/565 |
| 2008/0290944 | A1 * | 11/2008 | Sarpeshkar | H03F 1/26 |
| | | | | 330/261 |
| 2010/0182080 | A1 * | 7/2010 | Mak | H03F 3/45968 |
| | | | | 330/3 |

(Continued)

*Primary Examiner* — Thomas J. Hiltunen
*Assistant Examiner* — Khareem E Almo
(74) *Attorney, Agent, or Firm* — Michael T. Gabrik; Charles A. Brill; Frank D. Cimino

(57) ABSTRACT

A circuit includes first and second gain stages and an output transistor. The second gain stage includes a transconductance amplifier and a variable impedance circuit coupled to an output of the transconductance amplifier. The variable impedance circuit is configured to implement a first impedance level at frequencies below a first frequency threshold and to implement a second impedance level at frequencies above a second frequency level. The first impedance level is larger than the second impedance level. The output transistor has a control input coupled to the variable impedance circuit. At frequencies above the second frequency threshold, the second impedance level is configured to be inversely related to current through the output transistor.

12 Claims, 3 Drawing Sheets

(56) References Cited

U.S. PATENT DOCUMENTS

| | | | |
|---|---|---|---|
| 2011/0012678 A1* | 1/2011 | Kannan | H03H 11/1256 |
| | | | 330/253 |
| 2011/0121901 A1* | 5/2011 | Mirow | H03F 3/45475 |
| | | | 330/254 |
| 2019/0007009 A1* | 1/2019 | Berkhout | H03F 3/2175 |
| 2019/0081604 A1* | 3/2019 | Thiagarajan | H03F 3/45659 |
| 2019/0123692 A1* | 4/2019 | Dempsey | H03F 1/42 |
| 2020/0007088 A1* | 1/2020 | Ranta | H03F 3/213 |

* cited by examiner

DYNAMIC BIASING CIRCUIT

CROSS-REFERENCE TO RELATED APPLICATIONS

This continuation application claims priority to U.S. patent application Ser. No. 16/574,231, filed Sep. 18, 2019, which application claims priority to U.S. Provisional Application No. 201941015818, filed Apr. 22, 2019, both of which are hereby incorporated herein by reference in their entirety.

BACKGROUND

Many automobiles have a microphone to receive audio from a person in the automobile. Often, automobiles have an array of microphones to help in noise cancellation. Such microphones are biased by a regulated voltage.

SUMMARY

In one example, a circuit includes first and second gain stages and an output transistor. The second gain stage includes a transconductance amplifier and a variable impedance circuit coupled to an output of the transconductance amplifier. The variable impedance circuit is configured to implement a first impedance level at frequencies below a first frequency threshold and to implement a second impedance level at frequencies above a second frequency level. The first impedance level is larger than the second impedance level. The output transistor has a control input coupled to the variable impedance circuit. At frequencies above the second frequency threshold, the second impedance level is configured to be inversely related to current through the output transistor.

BRIEF DESCRIPTION OF THE DRAWINGS

For a detailed description of various examples, reference will now be made to the accompanying drawings in which.

DETAILED DESCRIPTION

Figure 1:
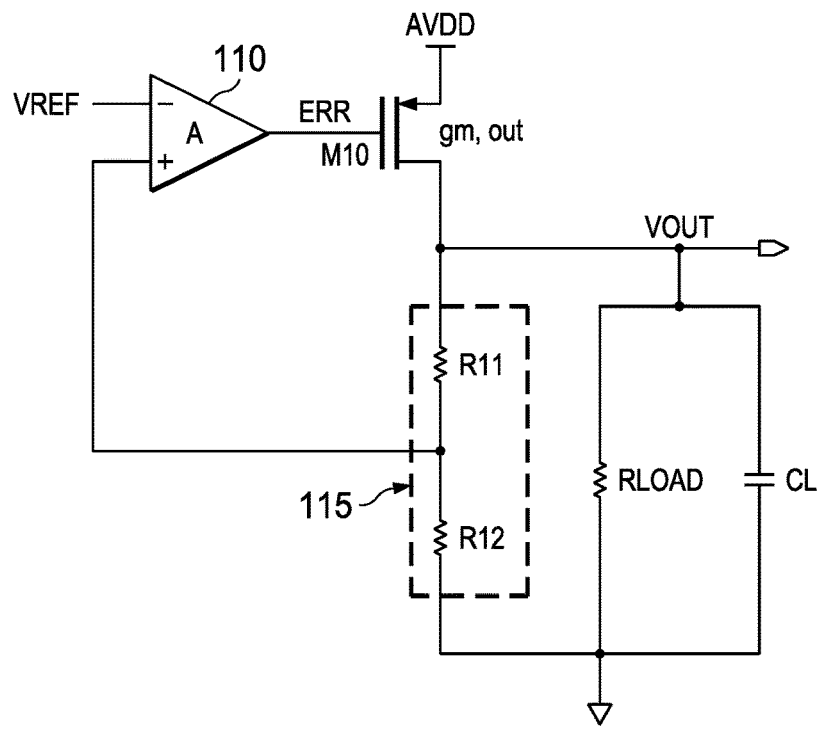
FIG. 1 illustrates an example of a regulation circuit to provide a regulated bias voltage to a load such as a microphone.

FIG. 1 illustrates a regulation circuit 100 coupled to a load RLOAD. In one example, RLOAD comprises one or more microphones, and the regulation circuit 100 provides a bias voltage to the microphone(s). The regulation circuit 100 includes an amplifier 110, a transistor M10, and a voltage divider 115. The voltage divider 115 in this example includes resistors R11 and R12. In this example, M10 comprises a p-type metal oxide semiconductor field effect transistor (PMOS), whose control input (gate) is coupled to the output of the amplifier 110, and whose source is coupled to a supply voltage (AVDD). The drain of M10 is coupled to the RLOAD and to the voltage divider 115. The node N1 between the resistors R11 and R12 is a scaled down version of the output voltage (VOUT). The positive (+) input of amplifier 110 is coupled to the node N1. The negative (−) input of amplifier 110 is coupled to a reference voltage VREF.

Based on the voltage difference between VREF and the voltage on node N1, the amplifier 110 generates an output error signal (ERR) to drive the gate of M10. If VOUT starts to increase, for example, the voltage on node N1 also increases and ERR increases. As a result of the gate voltage of M10 increasing, the source-to-gate voltage (Vsg) of M10 decreases, which causes less current to flow through M10 to RLOAD, thereby causing a decrease in VOUT. By contrast, responsive to VOUT decreasing, the amplifier 110 decreases ERR thereby driving M10 harder (increased Vsg) and increasing the current to RLOAD and increasing VOUT. As such, a feedback loop is formed between VOUT and M10.

A capacitor CL is coupled across RLOAD to help decrease noise to the load and to boost the high frequency power supply rejection ratio (PSRR). However, the inclusion of CL introduces a pole associated with the combination of RLOAD and CL. To help ensure stability, the bandwidth of amplifier 110 should be relatively large to avoid introducing an additional pole. It can be difficult, however, to provide an amplifier with a large enough bandwidth to ensure stability of the circuit. For instance, a large amount of current may be needed (which is otherwise not desirable) to be consumed by an amplifier to provide a sufficiently large bandwidth.

To help relax the bandwidth requirement on the amplifier 110, other techniques can be employed such as by cancelling or moving out the output pole through various circuit topologies. Some possible solutions, however, may result in any one or more of higher noise, decreased high frequency PSRR, poorer low frequency accuracy, and one or more large area circuit components (e.g., a large capacitor).

The example described herein achieves low noise in the audio band (e.g., less than 20 KHz), high DC accuracy along, satisfactory low frequency PSRR, relatively low area, and relatively low static current (also referred to as quiescent current). The disclosed example is stable over a wide load current range. Dynamic load biasing and frequency shaping is employed for the disclosed example as discussed below.

Figure 2:
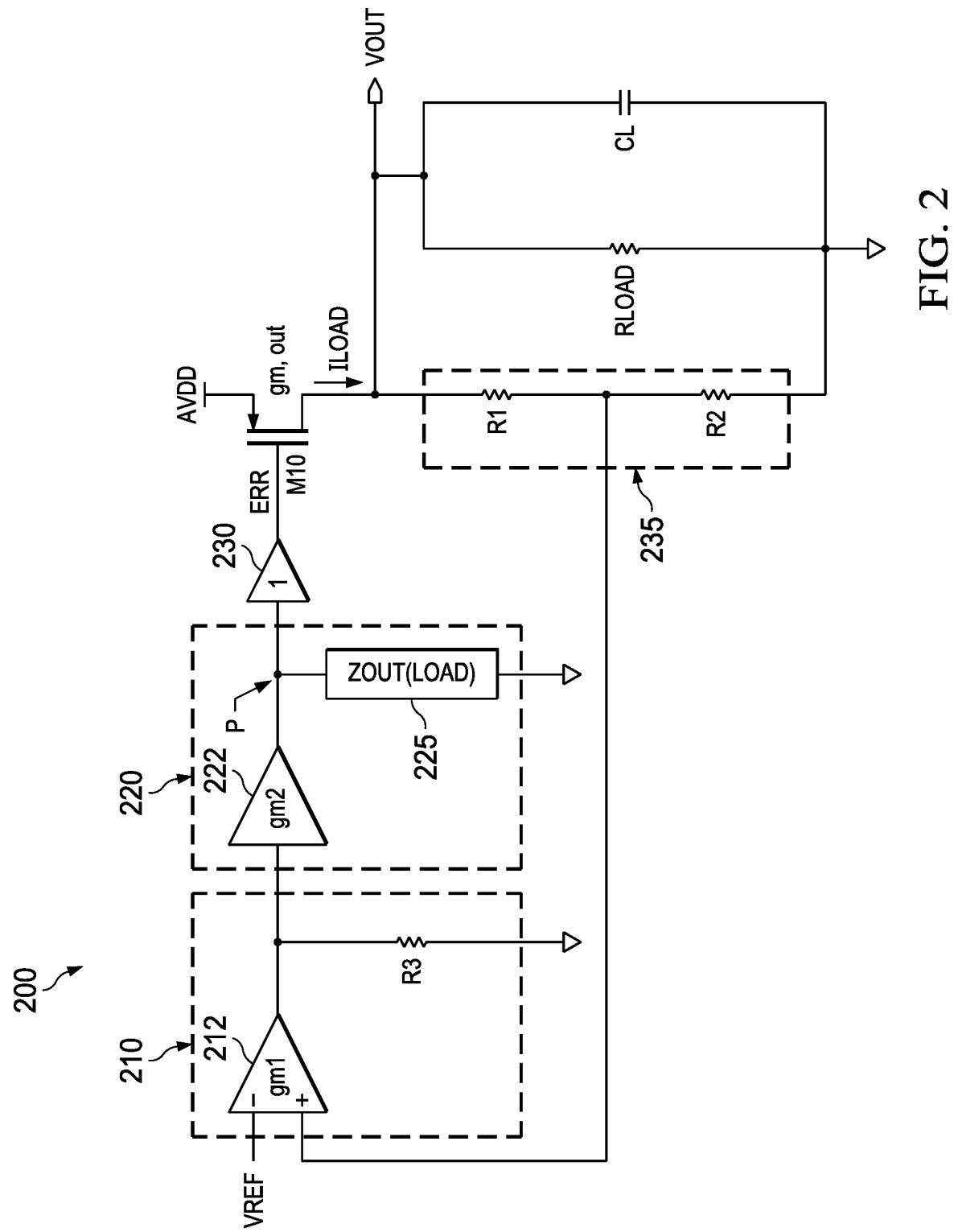
FIG. 2 shows another example of a regulation circuit.

FIG. 2 illustrates an example regulation circuit 200 that employs dynamic load biasing and frequency shaping (as further illustrated in FIG. 3) to provide a regulated bias voltage to a load such as a microphone. In this example, regulation circuit 200 includes a first gain stage 210, a second gain stage 220, a buffer 230 (e.g., unity gain), M10, and voltage divider 235 (comprising resistors R1 and R2). The load is shown as RLOAD and is coupled to capacitor CL. The first gain stage 210 comprises transconductance amplifier 212 coupled to a resistor R3. The reference voltage VREF is provided to one input (e.g., the negative input) of the transconductance amplifier 212, and the scaled down output voltage from the voltage divider 235 is provided to the other input (e.g., the positive input) of the transconductance amplifier. The output of the first gain stage is coupled to the input of the second gain stage. The second gain stage comprises transconductance amplifier 222 coupled to a variable impedance circuit 225, designated ZOUT(LOAD). The output of the second gain stage 220 is coupled to buffer 230 at node P, and the output of buffer 230 drives the gate of M10.

The first gain stage 210 provides a moderate gain. The transconductance of transconductance amplifier 212 is gm1 and the gain of the first gain stage 210 is gm1×R3. The gain of the second gain stage 220 is load current dependent and is given by gm2×ZOUT(LOAD). The impedance of ZOUT (LOAD) 225 also is referred to as ZOUT(LOAD) and is relatively high and constant with respect to load current, ILOAD, at low frequencies (e.g., below a first frequency threshold), but is reduced at higher frequencies (e.g., above a second frequency threshold) and inversely proportional to ILOAD at higher frequencies. The parenthetical reference to "LOAD" in ZOUT(LOAD) 225 indicates that ZOUT (LOAD) has an impedance that is related to load current above a predetermined frequency. At frequencies below a threshold (which is itself a function of load current), the magnitude of the load impedance of ZOUT(LOAD) 225 has little, if any, dependence on frequency. Further, at low frequencies (e.g., at DC), the impedance of ZOUT(LOAD) has little, if any, dependence on load current. At low frequencies, the magnitude of ZOUT(LOAD) is relatively high which helps to achieve excellent direct current (DC) accuracy and satisfactory PSRR within the audio band.

Figure 3:
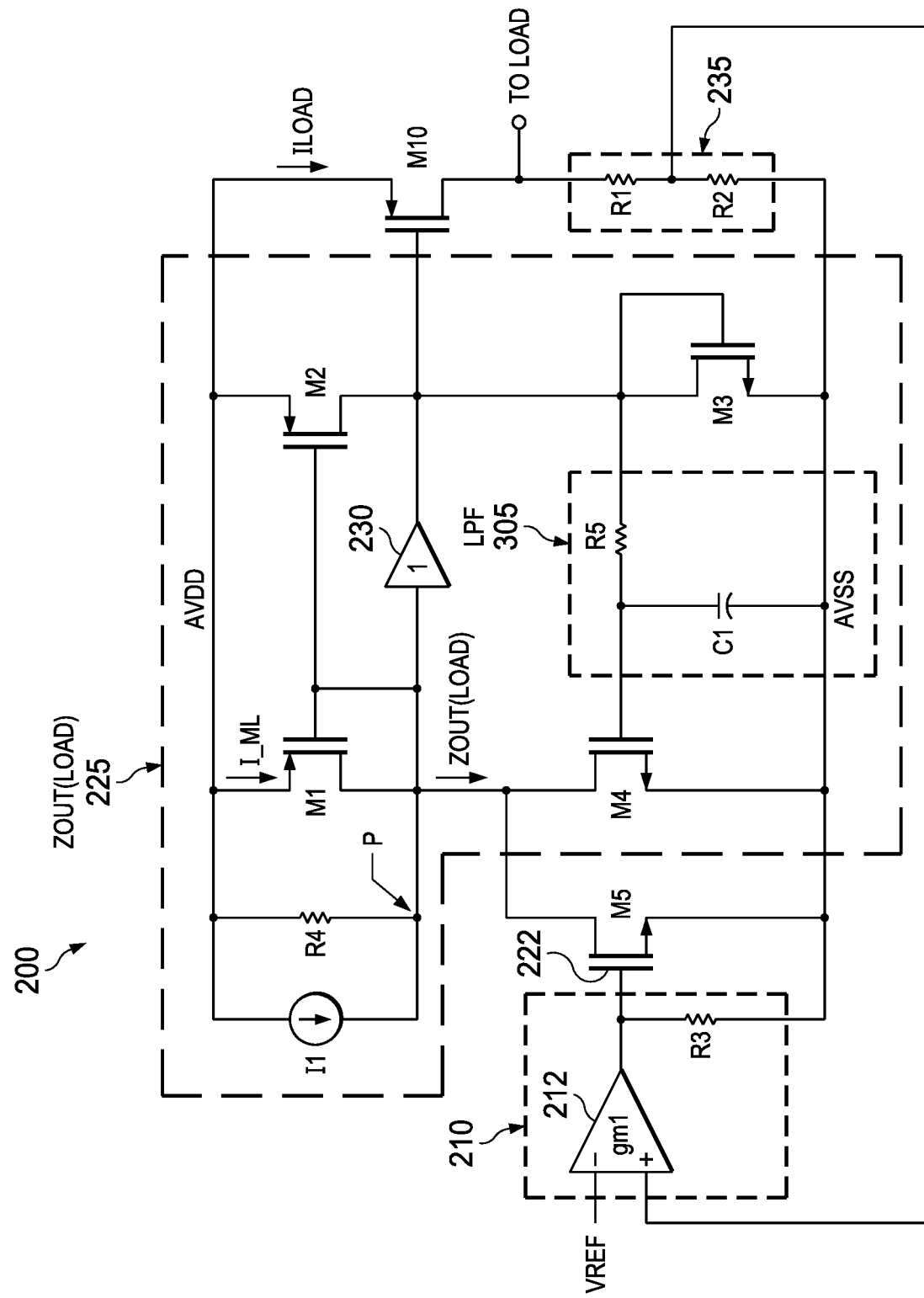
FIG. 3 illustrates a further implementation of the regulation circuit of FIG. 2.

FIG. 3 shows another illustration of the regulator circuit 200 including the first gain stage 210 and the second gain stage which, as shown, includes transistor M5 and ZOUT (LOAD) 225. Transistor M5 is shown as an n-type metal oxide semiconductor field effect transistor (NMOS) in this example. The gate of M5 is coupled to the output of transconductance amplifier 212 and resistor R3 as shown.

In this example, ZOUT(LOAD) 225 comprises transistors M1-M4, resistor R4, low pass filter 305, and current source I1. Low pass filter 305 includes an RC low pass filter comprising resistor R5 and capacitor C1. Transistors M1 and M2 comprise PMOS transistors, and transistors M3 and M4 comprise NMOS transistors. The gates of M1 and M2 are connected together, and the sources of M1 and M2 are connected together and to the supply voltage node (AVDD). The drains of M1, M4, and M5 are connected together at node P. Low pass filter 305 is coupled between M3 and M4. The gate of M3 is connected to the drain of M3 and to one terminal of R5. The other terminal of R5 is connected to C1 and to the gate of M4. C1 is connected between the gate and source of M4. The sources of M3 and M4 are connected together and to the other supply voltage node (AVSS). The drains of M2 and M3 are connected together. Resistor R4 is connected across M1, between its source and drains. Current source I1 is connected across R4. The input of buffer 230 is coupled to node P and the output of buffer 230 is connected to the gate of M10.

In an example, the size (ratio of channel width to channel length) of M1 is M times smaller than M10. The current through M1 (I_M1) tracks the ILOAD, and is ILOAD/M. M1 and M2 comprise a current mirror and thus the drain current through M2 is the same as through M1 (i.e., I_M1). As M3 is connected in series with M2, the drain current M3 also equals I_M1. At low frequencies, the low pass filter 305 couples the signal on the gate/drain of M3 to the gate of M4. As the sources of M3 and M4 are connected together as well, M3 and M4 form a current mirror at low frequencies, and thus the drain current M4 also equals I_M1. Thus, at low frequencies M1-M4 form a closed current loop. M5 is biased with current from I1 at low frequencies. As such, at low frequency, any change in current through M5 due the reaction of the loop from the voltage divider 235 to the first input stage 210 from a change in VOUT results in a change in current through R4. Accordingly, the impedance at node P at low frequency (i.e., the impedance of ZOUT(LOAD) equals R4. As the resistance of R4 is a constant, the impedance at node P also is constant regardless of load current.

At higher frequency (i.e., at frequencies above the cut-off frequency of low pass filter 305, the low pass filter prevents the signal from M3 from reaching M4 thereby preventing M4 from mirroring the current through M3. C1 represents a short at high frequencies thereby effectively turning off M4.

Figure 4:
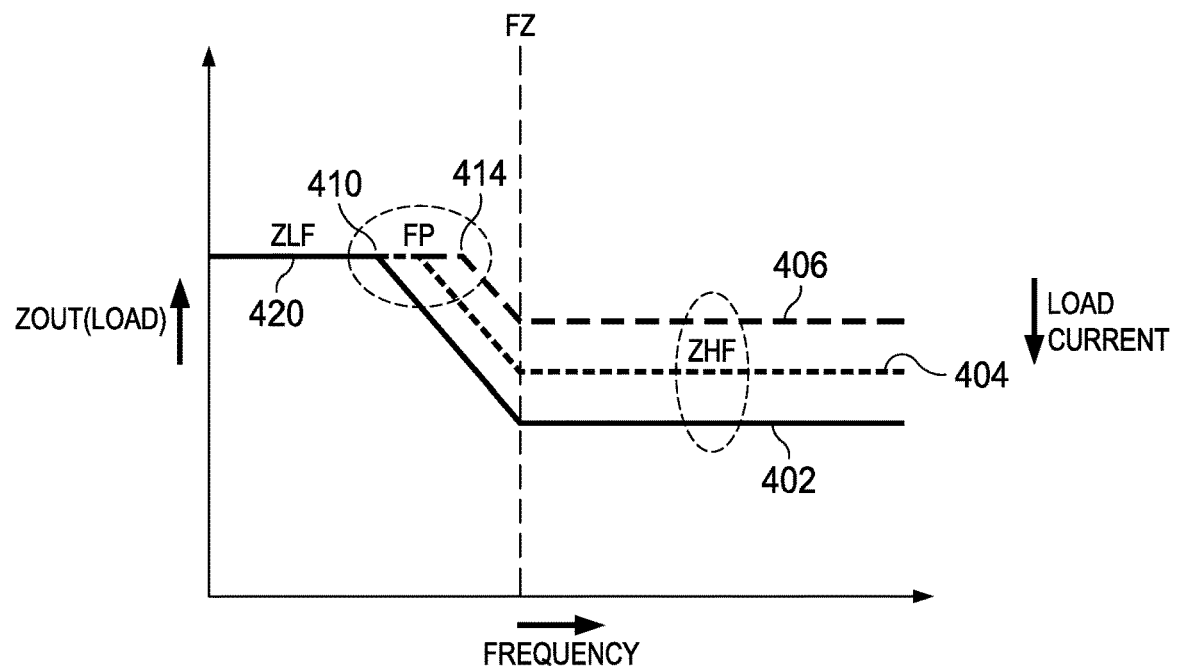
FIG. 4 illustrates a frequency response of the regulation circuit of FIGS. 2 and 3 also as a function of load current.

At this point (higher frequencies), current through M5 is provided by current through R4 and M1 (and I1). As such, the impedance at node P in this state is the parallel combination of R4 and the transconductance of M1 (gm_M1), which is given by Zhf=R4/(1+gm_M1×R4), where Zhf is the impedance of ZOUT(LOAD) at frequencies above the cut-off frequency of the low pass filter 305. Because I_M1 is proportional to ILOAD, then g_M1 is proportional to ILOAD as well, and thus Zhf is inversely proportional to ILOAD. ZOUT(LOAD) implementing a lower impedance at frequencies above the cut-off (corner) frequency of the low pass filter 305 and ZOUT(LOAD) being a function of load current at such frequencies helps to ensure stability over a wide range of load current FIG. 4 illustrates the frequency dependence on ZOUT (LOAD) for different load currents. At low frequencies (DC to the cut-off frequency fp of the low pass filter 305, the impedance of ZOUT(LOAD) is Zlf and is equal to R4 as explained above. Zlf is not dependent on frequency nor on load current, ILOAD. Frequency fp represents the frequency above which the impedance of ZOUT(LOAD) 225 is lower than Zlf. Above fz, the impedance of ZOUT(LOAD) is Zhf and is inversely related to ILOAD as explained above. The frequency fz is determined by R5 and C1 in FIG. 3 and is by 1/(2π*R5*C1).

Impedance curve 402 represents the impedance of ZOUT (LOAD) at larger load currents than for curves 404 and 406. A single zero is used to implement the corner frequencies fp. The frequency fp is given by: fz/(1+gm_M1*R4). Because gm_M1 is directly related to ILOAD, then fp is inversely related to ILOAD. That fp is inversely related to ILOAD can be observed in FIG. 4 as the corner frequency 410 for curve 402 (higher load current) is lower than the corner frequency 414 for curve 406 (lower load current). The frequency fp is, in part, a function of fz, which itself is a function of the cut-off frequency of the low pass filter 305. As such, the cut-off frequency of the low pass filter 305 is set to ensure that the corner frequency fp for the largest anticipated load current is at a sufficiently high level. For example, in the application of a microphone as a load, the smallest fp frequency, for the largest anticipated load current, will be set to be above audible frequency range (e.g., 20 KHz). With respect to frequency, the impedance of ZOUT(LOAD) reaches its smallest value for all load current levels at frequency fz. As such, impedance of ZOUT(LOAD) at the largest anticipated load currents (curve 402) has a longer range to drop from Zlf to its lowest level and thus has a lower corner frequency.

Stability in the example of FIGS. 2 and 3 is ensured by ZOUT(LOAD) having a relatively high impedance at lower frequencies and a lower impedance at higher frequencies and at higher load current. As such, the gain of the first gain stage 210 can be relaxed (reduced) and thus, the first gain stage 210 need not consume as much current as would be the case if the first gain stage 210 required a larger bandwidth to ensure stability.

"The term "couple" is used throughout the specification. The term may cover connections, communications, or signal paths that enable a functional relationship consistent with the description of the present disclosure. For example, if device A generates a signal to control device B to perform an action, in a first example device A is coupled to device B, or in a second example device A is coupled to device B through intervening component C if intervening component C does not substantially alter the functional relationship between device A and device B such that device B is controlled by device A via the control signal generated by device A.

What is claimed is:

1. A circuit, comprising:
   a first gain stage;
   a second gain stage comprising a transconductance amplifier and a variable impedance circuit coupled to an output of the transconductance amplifier, wherein the variable impedance circuit is configured to implement a first impedance level independent of an output load at frequencies below a first frequency threshold and to implement a second impedance level at frequencies above a second frequency threshold, the first impedance level larger than the second impedance level; and
   an output transistor having a control input coupled to the variable impedance circuit;
   wherein, at frequencies below the first frequency threshold, the variable impedance circuit is configured such that the first impedance level is independent of an amount of current through the output transistor; and
   wherein, at frequencies above the second frequency threshold, the variable impedance circuit is configured such that the second impedance level is inversely related to current through the output transistor.

2. The circuit of claim 1, wherein the variable impedance circuit comprises a first transistor, a second transistor, and a low pass filter coupled between the first and second transistors.

3. The circuit of claim 1, wherein the variable impedance circuit comprises:
   a first transistor coupled to the transconductance amplifier;
   a second transistor coupled to the first transistor to form a current mirror;
   a third transistor coupled to the second transistor;
   a fourth transistor coupled to the first transistor; and
   a low pass filter coupled between the third and fourth transistors.

4. The circuit of claim 3, wherein the second frequency threshold comprises a corner frequency of the low pass filter.

5. The circuit of claim 4, wherein, at frequencies above the corner frequency, the low pass filter decouples a signal between the third and fourth transistors.

6. The circuit of claim 3, wherein, at frequencies above the corner frequency, the fourth transistor is configured to be off.

7. The circuit of claim 3, wherein the low pass filter comprises a resistor coupled to a capacitor.

8. The circuit of claim 3, wherein the first transistor is configured to conduct current that is directly proportional to current through the output transistor.

9. The circuit of claim 8, wherein:
   at frequencies below the first frequency threshold, each of the second, third and fourth transistors is configured to conduct a current that is equal to the current through the first transistor; and
   at frequencies above the second frequency threshold, each of the second and third transistors is configured to conduct a current that is equal to the current through the first transistor, and the fourth transistor is configured to be turned off.

10. A system, comprising:
    a first gain stage;
    a second gain stage comprising a transconductance amplifier and a variable impedance circuit coupled to an output of the transconductance amplifier, wherein the variable impedance circuit is configured to implement a first impedance level at frequencies below a first frequency threshold and to implement a second impedance level at frequencies above a second frequency threshold, the first impedance level larger than the second impedance level;
    an output transistor having a control input coupled to the variable impedance circuit; and
    a load coupled to the output transistor and configured to receive current flowing through the output transistor;
    wherein, at frequencies below the first frequency threshold, the variable impedance circuit is configured such that the first impedance level is independent of an amount of current through the output transistor; and
    wherein, at frequencies above the second frequency threshold, the variable impedance circuit is configured such that the second impedance level is configured to be inversely related to an amount of current through the output transistor.

11. The system of claim 10, wherein the variable impedance circuit comprises a first transistor, a second transistor, and a low pass filter coupled between the first and second transistors.

12. The system of claim 10, wherein the variable impedance circuit comprises:
    a first transistor coupled to the transconductance amplifier;
    a second transistor coupled to the first transistor to form a current mirror;
    a third transistor coupled to the second transistor;
    a fourth transistor coupled to the first transistor; and
    a low pass filter coupled between the third and fourth transistors.

* * * * *